United States Patent
Schulte et al.

(10) Patent No.: US 9,086,446 B2
(45) Date of Patent: Jul. 21, 2015

(54) METHOD AND SYSTEM FOR B1 FIELD MAPPING IN MAGNETIC RESONANCE IMAGING

(75) Inventors: Rolf Feodor Schulte, Freising (DE); Laura Irene Sacolick, Munich (DE); William Allyn Grissom, Nashville, TN (US); Pekka Tapani Sipilä, Munich (DE)

(73) Assignee: General Electric Company, Niskayuna, NY (US)

( * ) Notice: Subject to any disclaimer, the term of this patent is extended or adjusted under 35 U.S.C. 154(b) by 831 days.

(21) Appl. No.: 13/306,577

(22) Filed: Nov. 29, 2011

(65) Prior Publication Data

US 2013/0134972 A1    May 30, 2013

(51) Int. Cl.
*G01R 33/24*    (2006.01)
*G01R 33/48*    (2006.01)
*G01R 33/483*    (2006.01)

(52) U.S. Cl.
CPC .......... *G01R 33/246* (2013.01); *G01R 33/4824* (2013.01); *G01R 33/4831* (2013.01)

(58) Field of Classification Search
USPC .......................... 324/300–322; 600/407–435; 382/128–131
See application file for complete search history.

(56) References Cited

U.S. PATENT DOCUMENTS

| | | | | |
|---|---|---|---|---|
| 5,382,902 A * | 1/1995 | Taniguchi et al. | ............ | 324/309 |
| 6,472,870 B1 * | 10/2002 | Bendall et al. | ................ | 324/307 |
| 6,989,673 B2 * | 1/2006 | Zhu | ................................ | 324/318 |
| 7,053,618 B2 * | 5/2006 | Zhu | ................................ | 324/318 |
| 7,075,301 B2 * | 7/2006 | Zhu | ................................ | 324/318 |
| 7,075,302 B2 * | 7/2006 | Zhu | ................................ | 324/318 |
| 7,346,498 B2 * | 3/2008 | Grigoryan | ..................... | 704/203 |
| 7,906,964 B2 | 3/2011 | Fleysher et al. | | |
| 7,982,462 B2 * | 7/2011 | Goelman et al. | ............. | 324/309 |
| 8,082,127 B2 * | 12/2011 | Ruhm | ........................... | 702/189 |
| 8,228,062 B2 * | 7/2012 | Sharp et al. | ..................... | 324/309 |
| 8,508,224 B2 * | 8/2013 | Schneider et al. | ............ | 324/309 |
| 8,890,527 B1 * | 11/2014 | Balcom et al. | ................ | 324/309 |
| 2004/0158459 A1 * | 8/2004 | Grigoryan | ..................... | 704/203 |
| 2005/0110487 A1 * | 5/2005 | Zhu | ................................ | 324/309 |
| 2005/0110488 A1 * | 5/2005 | Zhu | ................................ | 324/309 |
| 2005/0134267 A1 * | 6/2005 | Zhu | ................................ | 324/309 |
| 2005/0134268 A1 * | 6/2005 | Zhu | ................................ | 324/309 |
| 2009/0085564 A1 * | 4/2009 | Goelman et al. | ............. | 324/307 |
| 2010/0001727 A1 * | 1/2010 | Frydman et al. | ............. | 324/310 |
| 2010/0171499 A1 * | 7/2010 | Sharp et al. | ..................... | 324/318 |
| 2010/0253336 A1 * | 10/2010 | Schneider et al. | ............ | 324/309 |
| 2010/0286500 A1 * | 11/2010 | Ruhm | ........................... | 600/410 |
| 2010/0315084 A1 | 12/2010 | Sacolick et al. | | |
| 2011/0026799 A1 | 2/2011 | Nehrke et al. | | |
| 2013/0134972 A1 * | 5/2013 | Schulte et al. | ................ | 324/309 |

OTHER PUBLICATIONS

Sacolick et al.,"B1 Mapping by Bloch-Siegert Shift", Magnetic Resonance in Medicine,vol. 63, Issue 5, pp. 1315-1322, May 2010.

(Continued)

*Primary Examiner* — Melissa Koval
*Assistant Examiner* — Tiffany Fetzner
(74) *Attorney, Agent, or Firm* — Melissa K. Dobson

(57) ABSTRACT

A method of B1 field mapping relating to Magnetic resonance imaging (MRI) is given. In the method, RF and gradients are applied to excite and select a linear projection through a volume of interest; a radio frequency pulse sequence is transmitted to impart B1 dependent phase to the linear projection, following which a one dimensional spatial encoding signal is acquired along the linear projection; Subsequently a B1 field map based on the one dimensional spatial encoding signal is reconstructed.

24 Claims, 5 Drawing Sheets

(56) References Cited

OTHER PUBLICATIONS

Sacolick et al.,"B1 Mapping by Bloch-Siegert Shift", Joint Annual Meeting ISMRM-ESMRMB 2010, May 1-7, 2010, Stockholm, Sweden.

Wade.,"Mapping the Flip Angle in Magnetic Resonance Imaging Using the Accelerated 3D Look-Locker Sequence", The University of Western Ontario, Dec. 2010, London, Ontario, Canada.

Rolf Gruetter; "Automatic, Localized in Vivo Adjustment of All First- and Second-Order Shim Coils"; Magnetic Resonance in Medicine; pp. 804-811.

* cited by examiner

METHOD AND SYSTEM FOR B1 FIELD MAPPING IN MAGNETIC RESONANCE IMAGING

BACKGROUND

Embodiments presented herein relate generally to magnetic resonance imaging (MRI), and more particularly to mapping magnetic fields produced in MRI.

MRI is widely used for imaging of the human body for diagnostics and medical tests. MRI functions on the principle of nuclear magnetic resonance (NMR) of atoms of certain elements. One feature of NMR that enables imaging is that the resonance frequency of the nuclei of particular atoms is directly proportional to the strength of the applied magnetic field. An MRI system uses a powerful magnetic field (also known as B0 field) to align the magnetization of some atoms in the body, and radio frequency fields (also known as B1 field) to systematically alter the alignment of this magnetization. To produce high resolution images, the magnetic fields of the MRI system should be uniform, and free from distortion. Typically, MRI systems also comprise passive assemblies such as shaped metallic implements, or active assemblies such as electromagnets to homogenize and correct distortions in the magnetic field. Such homogenization is better known as shimming.

Specifically for in vivo imaging a highly homogenous magnetic field is required. Achieving such homogeneity introduces additional time consuming shimming iterations. Such additional time requirement is undesirable for human imaging operations. One known technique—"Fast Automatic Shimming Technique by Mapping Along Projections" or FASTMAP maps the B0 magnetic field along a small number of linear projections rather than imaging the entire volume of interest. FASTMAP allows for accurate B0 field shimming without iterations, and thus produces the desired B0 field homogeneity in short time duration.

Like the B0 field, in vivo imaging also requires a highly homogenous B1 field generated by the RF coils. Active shimming techniques for homogenizing the B1 field are known in the field as B1 mapping and are typically combined with spin-echo or gradient echo encoding. However, known techniques require a long time for accurate mapping of the B1 field. Some proprietary techniques for high speed B1 field mapping achieve short shimming time at the expense of resolution, and noise. Further, known B1 field mapping techniques image the complete volume of interest for accurate shimming.

Therefore, methods and systems are required for B1 field mapping, that overcome these and other problems associated with the known B1 field mapping techniques.

SUMMARY

A method of B1 field mapping relating to Magnetic resonance imaging (MRI) is given. In the method, a gradient and radio frequency (RF) pulse sequence are transmitted to excite one or more linear projections; and a radio frequency pulse sequence is transmitted to impart $B_1$ sensitivity to the spin system; following which a one dimensional spatial encoding signal is acquired along the linear projection; Subsequently B1 field is mapped based on the one dimensional spatial encoding signal.

Also disclosed in embodiments is an apparatus for magnetic resonance imaging (MRI) comprising a projection selector module for applying at least two gradients to select a linear projection through a volume of interest; an RF transmitter for transmitting a radio frequency (RF) pulse sequence to excite the linear projection; an RF receiver for acquiring a one dimensional spatial encoding signal along the linear projection; and a field mapping module for generating a B1 field map based on the one dimensional spatial encoding signal.

Further in one of the embodiment is a computer program product comprising a non-transitory computer readable medium encoded with computer-executable instructions for B1 field mapping, wherein the computer-executable instructions, when executed, cause one or more processors to: apply at least two gradients to select a linear projection through a volume of interest; transmit a radio frequency (RF) pulse sequence to excite the linear projection and impart B1 sensitivity; acquire a one dimensional spatial encoding signal along the linear projection; and generate a B1 field map based on the one dimensional spatial encoding signal.

DETAILED DESCRIPTION

Figure 1:
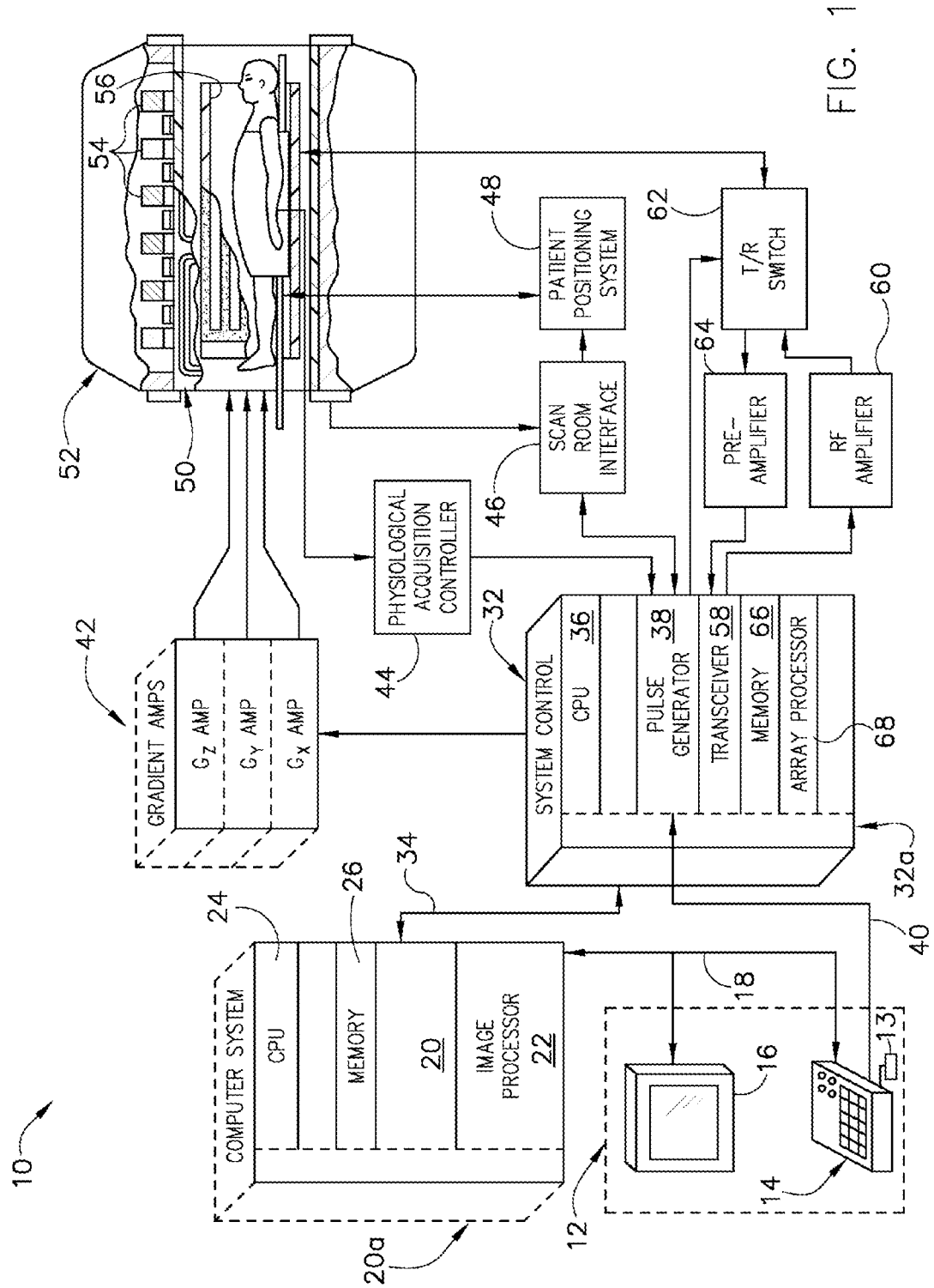
FIG. 1 illustrates an example MRI system, in which various embodiments may operate.

The following description is presented to enable any person skilled in the art to make and use the disclosed embodiments, and is provided in the context of a particular application and its requirements. Various modifications to the disclosed embodiments will be apparent to those skilled in the art, and the general principles defined herein may be applied to other embodiments and applications without departing from the spirit and scope of the present embodiments. Thus, the system is not limited to the embodiments shown, but is to be accorded the widest scope consistent with the principles and features disclosed herein.

Throughout the description, we use the following terminology. These terms may be generally known in the art, but are described below to clarify the subsequent descriptions.

The term Spin is a fundamental property of nature like electrical charge or mass. Spin comes in multiples of ½ and can be + or −. Protons, electrons, and neutrons possess spin. Individual unpaired electrons, protons, and neutrons each possess a spin of ½.

The term "B0" refers to the magnetic field applied to the subject in order to orient the spin of the atoms in one direction.

The term "B1" refers to the field produced by the radio frequency (RF) coils. The term rephasing or refocusing signifies the returning of spins to the same starting phase they had, at some time after the initial exciting RF pulse. E.g. spin echo sequences use 180° pulses to refocus the spins to generate signal echoes and gradient echo sequences use a refocusing pulse for it.

The term "linear projection" defines a projection on a subject in the form of linear columns. The projection columns can have any position or angular orientation. The RF projections are done through the linear columns such that a spatially encoded signal is obtained along the linear columns can be obtained individually.

The term Bloch-Siegert shift has been used to describe the effect where the resonance frequency of a nucleus shifts when an off-resonance RF field is applied. This effect is an additional contribution to the static B0 field that arises from the off-resonance component of the RF field.

The "Gradient coils" are used to produce controlled variations in the main magnetic field to provide spatial localization of the signals.

The term "shimming" refers to adjusting the homogeneity of a magnetic field. Shimming includes active shimming, or passive shimming. Passive shimming is the placement of metal pieces within the bore of the magnet or on the outer surface of the scanner in order to "distort" the magnetic field within the bore into a more homogenous state. Active shimming employs dedicated coils in the magnet through which current is passed (they may be resistive or superconducting depending on their placement) to generate an extra corrective magnetic field which improves the homogeneity.

The "Specific Absorption Rate (SAR)" is defined as the RF power absorbed per unit of mass of an object, and is measured in watts per kilogram (W/kg). The SAR describes the potential for heating of the patient's tissue due to the application of the RF energy necessary to produce the MR signal.

Referring to FIG. 1, the major components of a magnetic resonance imaging (MRI) system 10 incorporating the present invention are shown. The operation of the system is controlled from an operator console 12 which comprises a keyboard or other input device 13, a control panel 14, and a display screen 16. The console 12 communicates through a link 18 with a separate computer system 20 that enables an operator to control the production and display of images on the display screen 16. The computer system 20 comprises a number of modules which communicate with each other through a backplane 20a. These comprise an image processor module 22, a CPU module 24 and a memory module 26, known in the art as a frame buffer for storing image data arrays. The computer system 20 is linked to disk storage 28 and tape drive 30 for storage of image data and programs, and communicates with a separate system control 32 through a high speed serial link 34. The input device 13 can comprise a mouse, joystick, keyboard, track ball, touch activated screen, light wand, voice control, or any similar or equivalent input device, and may be used for interactive geometry prescription.

The system control 32 comprises a set of modules connected together by a backplane 32a. These comprise a CPU module 36 and a pulse generator module 38 which connects to the operator console 12 through a serial link 40. It is through link 40 that the system control 32 receives commands from the operator to indicate the scan sequence that is to be performed. The pulse generator module 38 operates the system components to carry out the desired scan sequence and produces data which indicates the timing, strength and shape of the RF pulses produced, and the timing and length of the data acquisition window. The pulse generator module 38 connects to a set of gradient amplifiers 42, to indicate the timing and shape of the gradient pulses that are produced during the scan. The pulse generator module 38 can also receive patient data from a physiological acquisition controller 44 that receives signals from a number of different sensors connected to the patient, such as ECG signals from electrodes attached to the patient. The pulse generator module 38 is connected to a scan room interface circuit 46 which receives signals from various sensors associated with the condition of the patient and the magnet system. A patient positioning system 48 receives commands from the scan room interface circuit 46 to move the patient on table 49 to the desired position(s) for the scan. The patient table 49 is preferably automatically movable along a longitudinal axis into and out of the scanner coincident with the length of a patient. The table 49 may be moved continuously or in steps.

The gradient waveforms produced by the pulse generator module 38 are applied to the gradient amplifier system 42 having $G_x$, $G_y$, $G_z$, and $G_{z2}$ amplifiers. Each gradient amplifier excites a corresponding physical gradient coil in a gradient coil assembly generally designated 50 to produce the magnetic field gradients used for spatially encoding acquired signals. The gradient coil assembly 50 forms part of a magnet assembly 52 which comprises a polarizing magnet 54 and a whole-body RF coil 56. A transceiver module 58 in the system control 32 produces pulses which are amplified by an RF amplifier 60 and coupled to the RF coil 56 by a transmit/receive switch 62. The resulting signals emitted by the excited nuclei in the patient may be sensed by the same RF coil 56 and coupled through the transmit/receive switch 62 to a preamplifier 64. The amplified MR signals are demodulated, filtered, and digitized in the receiver section of the transceiver 58. The transmit/receive switch 62 is controlled by a signal from the pulse generator module 38 to electrically connect the RF amplifier 60 to the coil 56 during the transmit mode and to connect the preamplifier 64 to the coil 56 during the receive mode. The transmit/receive switch 62 can also enable a separate RF coil (for example, a surface coil) to be used in either the transmit or receive mode.

Figure 2:
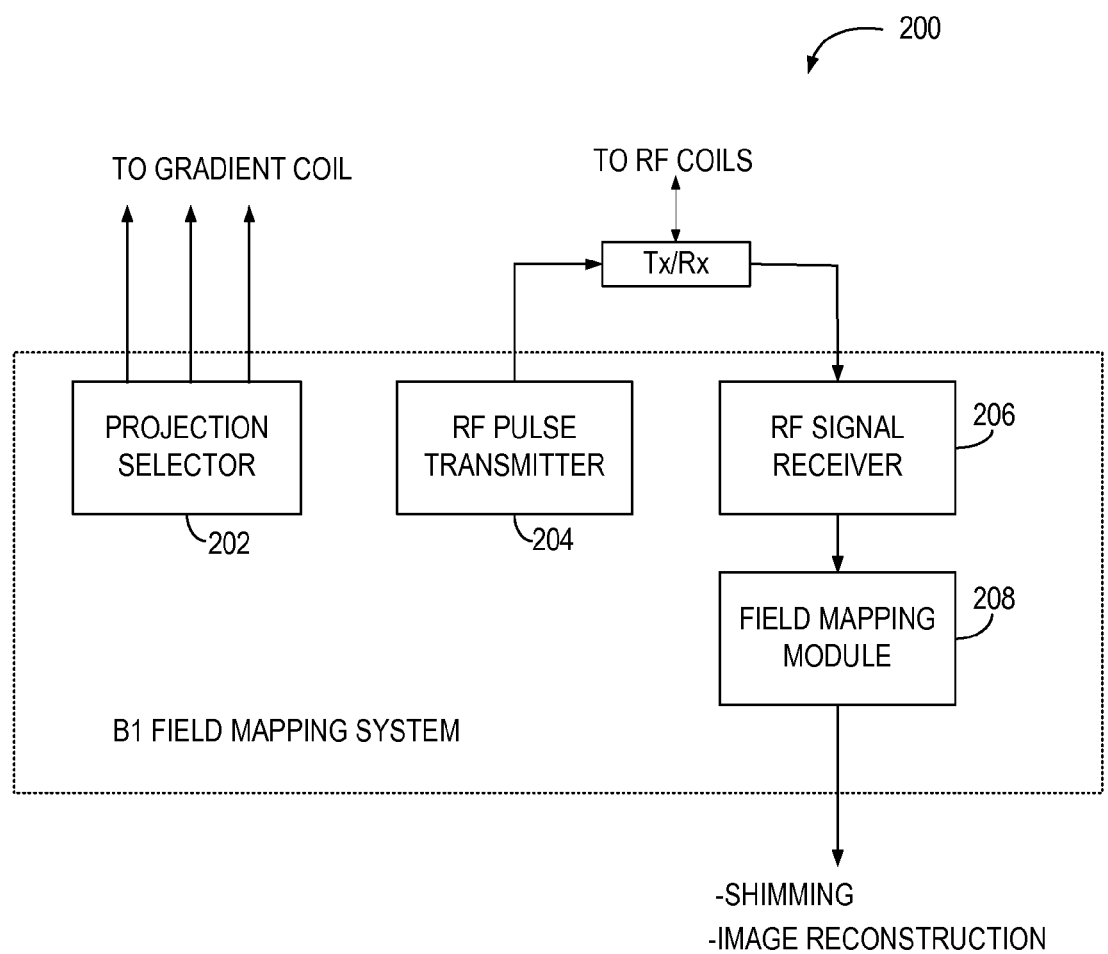
FIG. 2 illustrates a simplified block diagram of a system for B1 field mapping, according to one embodiment.

Referring now to FIG. 2, a simplified block diagram of an example B1 field mapping system 200 is illustrated, according to one embodiment. The B1 field mapping system 200 comprises a projection selector 202, an RF pulse transmitter 204, an RF signal receiver 206, and a field mapping module 208.

The projection selector 202 is configured to apply at least two gradients and at least two RF pulses to select a linear projection through the volume of interest. The projection selector 202 may generate signals to energize two or more gradient coils, and the RF coil, thus selecting a linear projection. In one implementation, the projection selector 202 may select the linear projection by selecting a slice plane with one particular orientation, and select another slice plane with an orthogonal orientation. Such a selection of two orthogonal slice planes results in the selection of the linear projection defined by the intersection of the two orthogonal slice planes. Selection of the slice planes and the linear projection, as described herein, refers to exciting atoms resident within the slice plane or the linear projection. Exciting atoms resident within the slice plane or the linear projection causes only the atoms resident within the slice plane or linear projection to emit an MR signal upon RF excitation. Atoms outside the slice plane or linear projection do not emit an MR signal with the RF excitation.

For instance, the projection selector 202 generates a first gradient signal to energize one or more gradient coils, thus applying a slice selection gradient to the volume of interest. The projections selector 202 generates an RF pulse to energize the RF coil, thus transmitting a slice selective pulse, substantially simultaneously with applying the slice selection gradient. The slice selection gradient modifies the precession frequency of atoms within the volume of interest, such that the slice selective pulse of the same frequency will cause them to resonate. Thus, the combination of the slice selection gradient and the slice selective pulse cause atoms located in the slice plane to be excited. The projection selector 202 may then generate another gradient signal and another slice selective pulse configured to select another slice plane orthogonal to the previously selected slice plane. Typically, the projection selector 202 may select the slice plane and the orthogonal slice plane within a time interval lower than an echo time of the atoms.

The projection selector 202 controls the orientation of the linear projection by controlling the orientation and position of the slice plane and the orientation and position of the orthogonal slice plane. The projection selector 202 controls the dimensions of the linear projection by controlling the bandwidth of the slice selective pulses, and strength of the slice selection gradients. The projection selector 202 controls the position of the linear projection by controlling the frequency band of the slice selective pulses. In other words, by controlling the orientation of the slice planes, the strength of the slice selection gradients, the bandwidth of the slice selective pulses, and the frequency band of the slice selective pulses, the projection selector 202 may select the linear projection having a desired orientation, a desired dimension, and a desired position.

In one implementation, the projection selector 202 may select the linear projections based on a known spatial location of the RF coil. In another implementation, the projection selector 202 may select the linear projections based on an estimated RF wavelength in the volume of interest. In yet another implementation, the projection selector 202 may select the linear projections based on prior known data such as, but not limited to, a known B1 field map, and known physical data of an MR scan.

Once the projection selector 202 selects the linear projection, the B1 field mapping system 200 measures the B1 field along the length of the linear projection. To measure the B1 field, the RF pulse transmitter 204 encodes the linear projection with a RF pulse sequence to impart B1 phase sensitivity to the linear projection. The RF signal receiver 206 then measures the B1 field along the linear projection.

The RF pulse transmitter 204 transmits an RF pulse sequence to encode the linear projection. The RF pulse sequence triggers the magnetic resonance phenomenon in the atoms within the linear projection. In other words, the RF pulse sequence induces B1 phase sensitivity into the linear projection. It will be appreciated that the selection of the linear projection and transmission of the RF pulse sequence may be performed in discrete successive steps. Alternatively, the selection of the linear projection and transmission of the RF pulse sequence may be performed in an interspersed manner. The RF transmitter 204 may refer to one single transmitter, an array of RF transmitters, or a selected subset of an array of transmitters.

The RF pulse transmitter 204 may transmit one of various RF pulse sequences to encode the linear projection. In one implementation, the RF pulse sequence comprises an excitation pulse followed by at least one refocusing pulse. Such an RF pulse sequence is similar to the RF encoding pulses transmitted in a typical Spin Echo MR imaging sequence. In another implementation, the RF pulse sequence comprises one or more off-resonance pulses, having a frequency different from the magnetic resonance frequency of the excited atoms within the linear projection. Such an RF pulse sequence is similar to the RF encoding pulses transmitted in a typical Bloch-Seigert shift MR imaging sequence. In yet other implementations, the RF pulse sequence may be similar to the RF encoding pulses transmitted in other MR imaging sequences such as the Gradient Echo MR sequence.

The RF signal receiver 206 then acquires a one dimensional spatially encoded signal along the linear projection. The RF signal receiver 206 may perform a frequency readout in the direction of the linear projection. The complex phase of the received signal is calculated, thus measuring the phase shift of the excited atoms, induced by the one or more off-resonance RF pulses. The phase shift of the excited atoms is representative of the B1 field strength. The RF signal receiver 206 may acquire the one dimensional spatial encoding signal by applying a readout gradient in the direction of the linear projection. Thus, effectively, the slice selection gradient, the orthogonal slice selection gradient, and the readout gradient are mutually orthogonal in direction. The gradient signals to apply the slice selection gradients, the selective RF pulse to select the linear projection, and the RF pulse sequence for encoding the linear projection and the readout gradient collectively form a magnetic resonance imaging sequence. In various embodiments, the magnetic resonance imaging sequence may be repeated to acquire the same spatially located linear projection multiple times. This may be repeated with the same RF and gradient parameters to acquire multiple averages. Alternatively, parameters of the RF and gradient imaging sequence may be varied in multiple acquisitions. For example, the frequency of the off-resonance RF pulse or pulses may be changed in the multiple acquisitions; the phase of the RF pulses may be varied; Or, the amplitude or magnitude of the gradient signals may be varied in the multiple acquisitions. The multiple acquisitions may be used to increase signal to noise ratio, or to remove artifacts from the B1 measurement.

Figure 5:
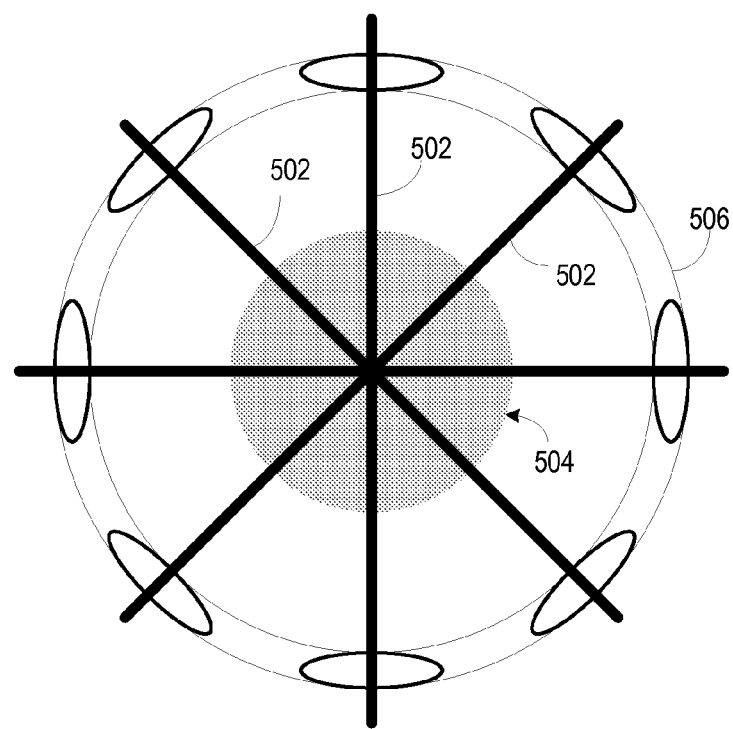
FIG. 5 represents another example of column geometry for B1 field mapping, according to one embodiment, each vector-like column projection extending from an RF coil.
Figure 6:
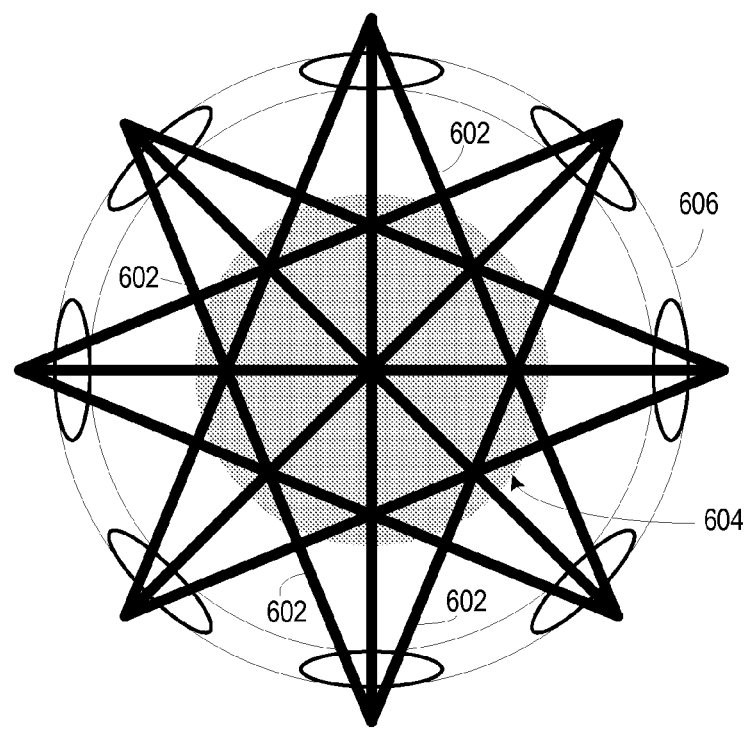
FIG. 6 represents another example of column geometry for B1 field mapping, according to one embodiment, such that the linear projection are shown as vector-like column projections.

It will be appreciated that the RF subsystem may comprise one or multiple transmit chains. In other words, the RF subsystem may comprise multiple RF coils (as illustrated in FIGS. 5 and 6), multiple RF amplifiers, multiple exciters, and so forth.

The field mapping module 208 generates a B1 field map based on the one dimensional spatial encoding signal acquired along the linear projection. The one dimensional spatial encoding signal comprises measurements of phase shift of the atoms within the linear projection, due to the encoding by the RF pulse sequence. The phase shift is representative of the B1 field strength. The B1 field map represents the B1 field strength at various points in space, within the patient bore of the MRI imager. Based on the one dimensional spatial encoding signal, the field mapping module 208 generates the B1 field map along the linear projection. In various embodiments, the B1 field mapping system 200 repeats the process for multiple linear projections to generate the B1 field map representing the B1 magnetic field for the volume of interest.

For high resolution imaging, the B1 field should be highly uniform. Such high uniformity in the B1 field may be achieved through active shimming techniques, for adjusting the magnetic field produced by the RF coils. The B1 field map generated by the field mapping module 208 may be used for such shimming techniques.

The B1 field mapping system 200 typically generates the B1 field map using one dimensional spatial encoding signals acquired along a preset number of linear projections. Such a technique significantly expedites the B1 shimming process, since the complete volume of interest is not imaged for the shimming of the RF coils. Rather, the B1 field strength is measured along a preset number of linear projections to generate the B1 field map to be used for shimming. As a result, the complete scan time of the MRI scan is typically reduced.

The projection selector 202, the RF pulse transmitter 204, the RF pulse receiver 206, and the field mapping module 208 may be implemented using any combination of hardware or software components. For instance, one or more of the modules may be implemented as digital circuits, analog circuits or a combination of analog and digital circuits. Alternatively, one or more of the modules may be implemented as software stored on a non-transitory computer readable medium such as a hard disc, an optical disc, a solid state memory device, a volatile memory device such as Random Access Memory (RAM), and so forth. The software may be executable on a general purpose processor such as the x86, and x64 based processors manufactured by Intel® corporation, and AMD® corporation. Alternatively, the software may be executable on a specific purpose processor such as a digital signal processor (DSP). The process steps executed by such software are explained in conjunction with FIG. 3 below.

Figure 3:
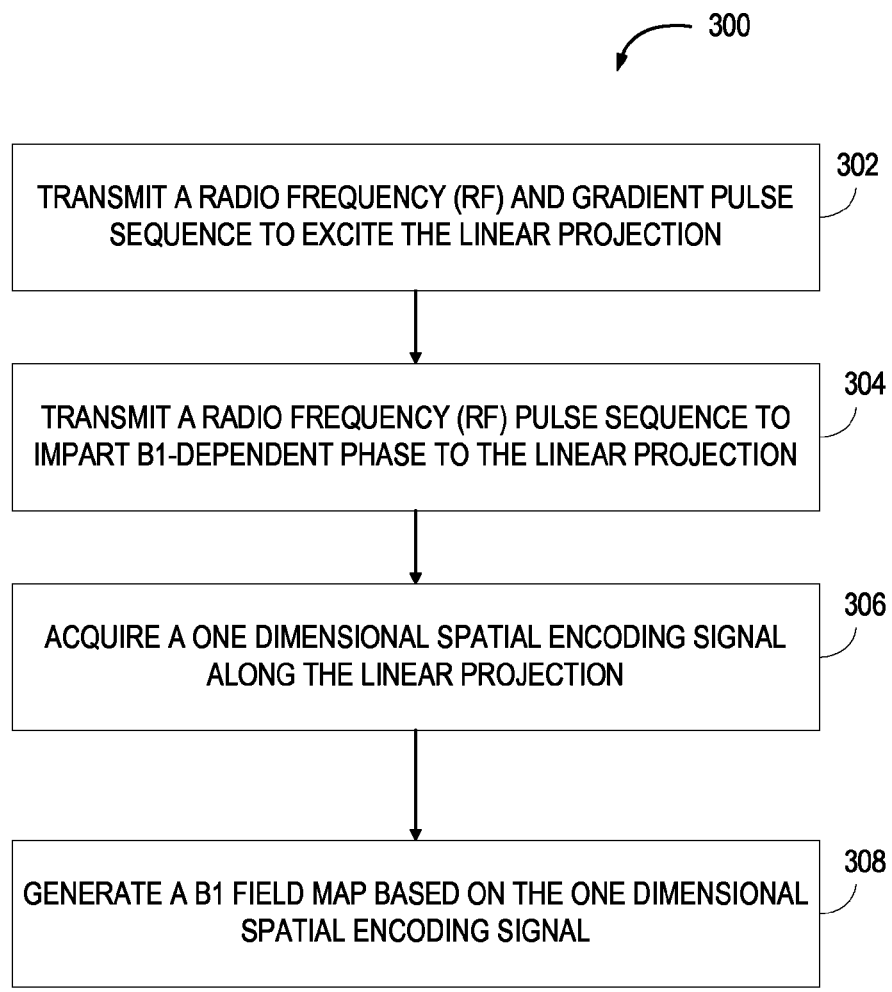
FIG. 3 is a flowchart of an example method for B1 field mapping, according to one embodiment.

FIG. 3 is a flowchart of an example method for B1 field mapping, according to one embodiment.

The first step 302 is to select a linear projection through a volume of interest using gradient coils. The apparatus usually but not necessarily has, three sets of gradients residing along the coordinate axes—x, y, and z—and produce a magnetic field variation determined by the magnitude of the applied current in each coil set. The next step 304 involves transmitting a radio frequency (RF) pulse sequence to excite the linear projection; The linear projections could be in the form of columns. The projection columns selected are sufficient to map a desired area. The projection columns can have any angular orientation. Further in next step 306 a one dimensional spatial encoding signal is acquired along the linear projection. The spatial encoding signal could be phase encoding signal. Finally in step 308 a B1 field map is generated based on the one dimensional spatial encoding signal.

The overall B1 mapping operation can be carried out by a computer using instructions encoded in a computer executable program. The computer executable program may be stored on a non-transitory computer readable medium, such as, but not limited to, flash memory, Random access memory (RAM), hard disc drives, optical discs, and so forth.

In another embodiment only a subset of the entire RF field coils is selected and the selected coils channels are mapped. The selection of the field coils may be done by a computer reading instructions from an executable program.

The column geometry may be based on physical parameters of the MRI system 200. For example, columns may be placed given the known spatial locations of RF coil(s), and spaced given the estimated RF wavelength in the subject. Alternatively, column geometry can be data-based. For example, determined from a database of acquired B1 maps. In some embodiments, the column geometry may be determined by a combination of physical parameters and data based knowledge. The column locations and orientations may be coil-specific or general.

The column selected may be weighted according to prior-knowledge or according to the region of interest. Also, the weighting may be selected based on at least one of optimizing a conditioning for the reducing or minimizing noise or noise sensitivity, or reducing or minimizing a specific absorption rate.

Figure 4:
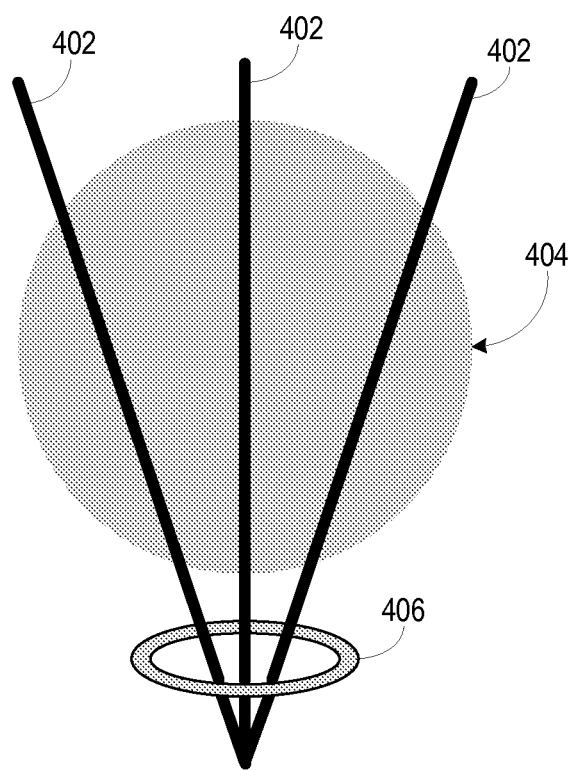
FIG. 4 represents an example of column geometry for B1 field mapping, according to one embodiment, the column geometry is vector-like extending from the RF coil.

FIG. 4 illustrates an example of column geometry, according to one embodiment. FIG. 4 illustrates linear projections 402 as vector-like column projections extending from an RF coil 406 through the volume of interest 404. The linear projections 402 are selected based on the position of an RF coil 406, such as a surface RF coil.

FIG. 5 illustrates an example of column geometry, each vector-like column projection extending from an RF coil according to one embodiment. FIG. 5 illustrates linear projections 502 through the volume of interest 504. The linear projections 502 are perpendicular to each RF element of a multi-rung coil 506. The multi-rung coil 506 may be, for example, a bird cage coil, a strip-line TEM array, a parallel transmit array, and the like.

FIG. 6 illustrates an example column geometry, according to one embodiment. FIG. 6 illustrates linear projections 602 through the volume of interest 604. The linear projections 602 are selected such that three linear projections 602 pass through each RF element of a multi-rung coil 606. The multi-rung coil 606 may be, for example, a bird cage coil, a strip-line TEM array, a parallel transmit array, and the like.

The columns geometry shown in FIGS. 4, 5, and 6 are two dimensional. However, the column geometry may also extend to three dimensions.

In one of the embodiment the RF coil irradiate positive shift off resonance pulses and then negative shift off resonance pulses on the subject through the column geometry selected. In the process the Bloch-Siegert phase shift is encoded by an off-resonance pulse. Subsequently, at least one refocusing pulse may be applied. A one dimensional spatial encoding signal is then acquired along the linear projection. The process may be repeated with a pulse having positive shift about the resonance frequency and with another pulse with a negative shift about the resonance frequency. The phase difference between the two signal thus obtained relates to the transmitted B1 field. The projections selected are such that different projections through the object encode the B1 distribution sufficiently.

In another embodiment the RF coil may uses an excitation RF pulse followed by one or more evenly spaced refocusing or further excitation RF pulses to irradiate through the selected columns. In response, a one dimensional encoding signal is obtained. The received signal is used to map the B1 field.

Full B1 map data may be inferred from the B1 fields acquired along projections. Full B1 map data may be inferred by fitting the acquired projection data to analytical basis functions. The basis function set may comprise spherical harmonics, Bessel functions, polynomials, splines, Fourier series, Chebychev series, for example. The basis of reconstruction may also be stored library B1 data. The said post reconstruction can be carried out with weighting of different projection columns.

In another embodiment a post processing of the individual maps may be done to combine together the maps to form a full B1 map. The B1 maps obtained can be combined with B0 maps to give B1/B0 (also B0/B1) mapping which may be an important parameter in shimming of field in MRI operations.

In another embodiment a controlling device may be attached with system which would obtain and analyze B1/B0 information. Using the information analysis it may adjust the current flowing in the shim coils hence controlling and maintaining the homogeneity of the field. It is to be noted that more uniform the field is better will be the images obtained from the MRI system. The shimming operation can be carried out for both B0 and B1 shimming hence maintaining homogeneity of both B0 and B1 field.

Inhomogeneity of the RF field leads to a local exposure where most of the absorbed energy is applied to one body region rather than the entire person, leading to a local SAR. Using B1 maps, such zones may be identified and local SAR may be reduced by invoking changes on the RF coil(s) impacting the region.

While magnetic resonance field map essentially consist of circularly polarized components of the RF transverse magnetic fields (B1 field), the thermal heat and electromagnetic power deposition is generated by the associated electric fields. Measurement of electric field distributions/intensities across a sample yields an indirect indication of possible cause of heating within the sample and potentially enables the detection of "hot spots," which can be present within inhomogeneous radiofrequency (RF) fields, such as the case with magnetic resonance imaging at high field strength.

Also in modern magnetic resonance imaging (MRI), patients are exposed to strong, non uniform static magnetic fields outside the imaging region, in which the movement of the body may be able to induce electric currents in tissues which may be possibly harmful. The B1 map thus obtained would help in the spatial distribution of induced electric fields in the patient and hence tracking down the regions with high induced electric field when moving into the MRI scanner and also for head motion at various positions in the magnet.

Further, B1 maps may be used, for example, to adjust transmit gain of the RF transmit chain to produce an RF pulse at a specific flip angle, to design multi-transmit channel RF pulses, to aid in implementation of chemical shift imaging, to correct images for shading resulting from B1 inhomogeneity, and to calculate electrical properties of tissue, such as permittivity or conductivity.

One advantage of using linear projections to map the B1 field is significant reduction in computing requirements, and scan time, as compared to using the complete scan to map the B1 field. Various embodiments presented herein may save power used in MRI process as B1 field mapping of the complete volume of interest may be obtained using a small number of projections.

The invention claimed is:

1. A method of magnetic resonance (MR) B1 field mapping with a magnetic resonance imaging (MRI) system comprising:
    transmitting with a plurality of MR imaging radio frequency (RF) coils, both a radio frequency (RF) pulse sequence and a gradient pulse sequence, in order to excite a linear projection that passes through a volume of interest;
    transmitting with the plurality of MR imaging RF coils a radio frequency (RF) pulse sequence in order to impart B1 sensitive phase into the linear projection;
    acquiring a one dimensional spatially encoded signal along the linear projection with the MRI system; and
    generating a B1 field map of the MRI system, based on the one dimensional spatially encoded signal that has been acquired along the linear protection;
    wherein the volume of interest is defined by a geometric placement, of the plurality of the RF coils at specified locations, within the MRI system;
    wherein the linear projection is in the form of one or more vector-like columns extending from one or more of the plurality of RF coils, that passes through the volume of interest; and
    wherein each of the one or more vector-like columns, of the linear projection have a column geometry, while also being individually spaced according to an estimated RF wavelength that passes through the volume of interest.

2. The MR B1 field mapping method of claim 1 further comprising:
    acquiring a plurality of one dimensional spatially encoded signals, along the linear projection, with the MRI system;
    computing an average of the plurality of one dimensional spatially encoded signals with the MRI system; and
    generating a B1 field map of the MRI system, based on the computed average;
    wherein geometry of the one or more vector-like columns of the linear projection is further determined with data based knowledge of any acquired B1 field map(s).

3. The MR B1 field mapping method of claim 2 further comprising:
    varying one or more RF pulse sequence or gradient pulse sequence parameters of the linear projection with respect to each acquisition of the plurality of one dimensional spatially encoded signals,
    wherein the RF pulse sequence or gradient pulse sequence parameters comprise a frequency of off-resonance RF pulses, a phase of the RF pulses, and an amplitude of the gradient pulse sequence signals.

4. The MR B1 field mapping method of claim 1, wherein:
    the RF pulse sequence comprises one or more off resonance pulses having a frequency which is different from the resonant frequency; and
    the one dimensional spatially encoded signal also comprises a phase shift signal.

5. The MR B1 field mapping method of claim 1, wherein:
    the RF pulse sequence comprises an excitation pulse, and at least one refocusing pulse; and
    the one dimensional spatially encoded signal also comprises a phase shift signal.

6. The MR B1 field mapping method of claim 1, further comprising a step of weighting the one or more vector-like columns either according to prior-knowledge or according to a region of interest.

7. The MR B1 field mapping method of claim 6, wherein the weighting of the one or more vector-like columns is selected based on at least one of;
    a) optimizing a conditioning that results in reducing or minimizing noise,
    b) optimizing a conditioning that results in noise sensitivity, or
    c) optimizing a conditioning that results in reducing or minimizing a specific absorption rate.

8. The MR B1 field mapping method of claim 1 further comprising shimming a B1 magnetic field of the MRI system, based on the B1 field map.

9. A magnetic resonance imaging (MRI) system comprising:
    a plurality of MR imaging radio frequency (RF) coils
    a projection selector module configured for applying at least two gradients in order to select a linear projection that passes through a volume of interest;
    an RF transmitter configured for transmitting both a radio frequency (RF) pulse sequence and a gradient pulse sequence, in order to excite the linear projection that passes through the volume of interest;
    an RF receiver configured for acquiring a one dimensional spatially encoded signal along the linear projection; and
    a field mapping module configured for generating a B1 field map based on the one dimensional spatially encoded signal that has been acquired along the linear projection;
    wherein the volume of interest is defined by a geometric placement, of the plurality of the RF coils at specified locations, within the MRI system;
    wherein the linear projection is in the form of one or more vector-like columns extending from one or more of the plurality of RF coils, that passes through the volume of interest; and wherein each of the one or more vector-like columns, of the linear projection have a column geometry, while also being individually spaced according to an estimated RF wavelength that passes through the volume of interest.

10. The MRI system of claim 9, wherein:
the RF receiver is configured to acquire a plurality of one dimensional spatially encoded signals along the linear projection with the MRI system; and
the field mapping module is configured to compute, with the MRI system, an average of the plurality of one dimensional spatially encoded signals, and then generate a B1 field map with the MRI system based on the computed average;
wherein geometry of the one or more vector-like columns of the linear projection is further determined with data based knowledge of any acquired B1 field map(s).

11. The MRI system of claim 10, wherein the RF transmitter is configured to vary one or more RF pulse sequence or gradient pulse sequence parameters of the linear projection with respect to each acquisition of the plurality of one dimensional spatially encoded signals, wherein the RF pulse sequence or gradient pulse sequence parameters comprise a frequency of off-resonance RF pulses, a phase of the RF pulses, and an amplitude of the gradient pulse sequence signals.

12. The MRI system of claim 9, wherein:
the RF pulse sequence comprises one or more off resonance pulses having a frequency which is different from the resonant frequency; and
the one dimensional spatially encoded signal also comprises a phase shift signal.

13. The MRI system of claim 9, wherein:
the RF pulse sequence comprises an excitation pulse, and at least one refocusing pulse; and
the one dimensional spatially encoded signal also comprises a phase shift signal.

14. The MRI system of claim 9, wherein the MR sequence module weights the one or more vector-like columns either according to prior-knowledge or according to a region of interest.

15. The MRI system of claim 14, further comprising a reconstruction library of stored B1 data, found within the MR sequence module and wherein the MR sequence module selects the weighting of the one or more vector-like columns, of the one dimensional spatially encoded linear projection, different based on at least one of:
a) optimizing a conditioning that results in reducing or minimizing noise,
b) optimizing a conditioning that results in noise sensitivity, or
c) optimizing a conditioning that results in reducing or minimizing a specific absorption rate.

16. The MRI system of claim 9 further comprising a shimming module configured for shimming a B1 magnetic field of the MRI system, based on the B1 field map, the B1 field map being combinable with B0 maps in order to give either a B1/B0 or a B0/B1 mapping.

17. A computer program product comprising a non-transitory computer readable medium encoded with computer-executable instructions that perform magnetic resonance (MR) B1 field mapping, with a magnetic resonance imaging (MRI) system, wherein the computer-executable instructions, when executed, cause one or more processors to:
transmit with a plurality of MR imaging radio frequency (RF) coils, both a radio frequency (RF) pulse sequence and a gradient pulse sequence in order to excite a linear projection that passes through a volume of interest;
transmit with the plurality of MR imaging RF coils a radio frequency (RF) pulse sequence in order to impart B1-dependent phase into the linear projection;
acquire a one dimensional spatially encoded signal along the linear projection with the MRI system; and
generate a B1 field map of the MRI system, based on the one dimensional spatially encoded signal that has been acquired along the linear projection;
wherein the volume of interest is defined by a geometric placement, of the plurality of the RF coils at specified locations, within the MRI system;
wherein the linear projection is in the form of one or more vector-like columns extending from one or more of the plurality of RF coils, that passes through the volume of interest; and
wherein each of the one or more vector-like columns, of the linear projection have a column geometry, while also being individually spaced according to an estimated RF wavelength that passes through the volume of interest.

18. The computer program product of claim 17 further comprising computer executable instructions in order to cause the one or more processors to:
acquire a plurality of one dimensional spatially encoded signals along the linear projection with the MRI system;
compute an average of the plurality of one dimensional spatially encoded signals with the MRI system; and
generate a B1 field map with the MRI system based on the computed average;
wherein geometry of the one or more vector-like columns of the linear projection is further determined with data based knowledge of any acquired B1 field map(s).

19. The computer program product of claim 18 comprising computer executable instructions in order to cause the one or more processors to vary one or more RF pulse sequence or gradient pulse sequence parameters of the linear projection with respect to each acquisition of the plurality of one dimensional spatially encoded signals, wherein the RF pulse sequence or gradient pulse sequence parameters comprise a frequency of off-resonance RF pulses, a phase of the RF pulses, and an amplitude of the gradient pulse sequence signals.

20. The computer program product of claim 17, wherein:
the RF pulse sequence comprises one or more off resonance pulses having a frequency which is different from the resonant frequency; and
the one dimensional spatially encoded signal also comprises a phase shift signal.

21. The computer program product of claim 17, wherein:
the RF pulse sequence comprises an excitation pulse, and at least one refocusing pulse; and
the one dimensional spatially encoded signal also comprises a phase shift signal.

22. The computer program product of claim 17 further comprising computer executable instructions in order to cause the one or more processors to select the linear projection based on weighting the one or more vector-like columns either according to prior-knowledge or according to a region of interest.

23. The computer program product of claim 22 further comprising computer executable instructions in order to cause the one or more processors to select the linear projection based on weighting the one or more vector-like columns by at least one of:
a) optimizing a conditioning that results in reducing or minimizing noise,
b) optimizing a conditioning that results in noise sensitivity, or c) optimizing a conditioning that results in reducing or minimizing a specific absorption rate.

24. The computer program product of claim 17 further comprising computer executable instructions in order to cause the one or more processors to shim a B1 magnetic field of the MRI system based on the generated B1 field map, where the one or more vector-like columns of the linear projection are each weighted differently, based on a reconstruction library of stored B1 data, found within the one or more processors.

* * * * *